United States Patent [19]

Mears, Jr.

[11] 3,757,590

[45] Sept. 11, 1973

[54] PUSHBUTTON ASSEMBLY

[75] Inventor: Donald B. Mears, Jr., Thompsonville, Conn.

[73] Assignee: General Instrument Corporation, Newark, N.J.

[22] Filed: June 30, 1972

[21] Appl. No.: 267,909

[52] U.S. Cl. .................................... 74/10.33, 334/7

[51] Int. Cl. .............................................. F16h 35/18

[58] Field of Search ......................... 74/10.33; 334/7

[56] References Cited

UNITED STATES PATENTS

| | | | |
|---|---|---|---|
| 3,403,564 | 10/1968 | Ohashi | 74/10.33 |
| 3,545,288 | 12/1970 | Ohashi | 74/10.33 |
| 3,545,289 | 12/1070 | Ohasi | 74/10.33 |
| 3,074,284 | 1/1963 | Teaf | 74/10.33 |
| 3,195,359 | 7/1965 | Clark | 74/10.33 |

*Primary Examiner*—Allan D. Herrmann

*Attorney*—Maxwell James et al.

[57] ABSTRACT

A pushbutton assembly for preset tuning is provided with a simple and effective mechanism for biasing the operative pushbutton slide into engagement with the front guide opening in response to pressure on the pushbutton thereby to significantly improve tuning accuracy. For this purpose a pushbutton support member is provided with inclined slots receiving projections formed on an auxiliary member movable with the pushbutton slide. As the pushbutton is pressed inwardly the camming action between the projections and inclined slots force the pushbutton support upwardly into engagement with the upper edge of the guide opening, that engagement in turn forcing the pushbutton slide against the lower edge of the guide opening to insure angular stability of the slide throughout the pushbutton stroke. The auxiliary member in turn carries a clamping mechanism adapted to lockingly engage an adjusting cam pivotally mounted on the pushbutton slide as the cam is forced into engagement with the tuning control element for initial setting.

3 Claims, 12 Drawing Figures

PUSHBUTTON ASSEMBLY

The present invention relates to a novel and improved construction for a pushbutton device of a type utilized for preset tuning of automobile radios and the like, and more particularly to a device of this type including means to eliminate lateral play between the pushbutton assembly and the front panel framework within which it is operatively mounted.

Pushbutton devices of the type described are specifically designed for use in radio receivers or the like where preset pushbutton actuation is desirable. For example, in automobile radios it is desirable for the driver to be able to tune the radio by a simple pushbutton actuation to a preselected frequency without visual observation of the continuous tuning mechanism. In pushbutton constructions designed for this purpose, an adjustable setting device is carried by or operatively connected to the pushbutton and its position relative to the pushbutton may be altered, usually to correspond with the selected radio frequency to which the unit has been manually pretuned by the continuous tuning mechanism. Means are provided to firmly lock the setting device in that altered position, thereby to permit subsequent actuation of the pushbutton to tune the unit to the preselected radio frequency. The adjustable setting device is typically in the form of a cam articulately mounted on a slide which in turn is suitably mounted for sliding movement within the tuning unit. An auxiliary member to which the pushbutton is secured is also movably mounted within the unit so as to move with the support and so as to have a limited degree of movement with respect thereto, the relative position of the movable slide and the auxiliary member controlling the actuation of a clamping mechanism and causing that clamping mechanism to operatively engage or disengage the setting device thereby to lock it in or release it from the adjusted position.

The auxiliary member is typically slidably mounted in the front panel framework of the receiver, extends outwardly thereof and carries the pushbutton. Accordingly, when the setting device is locked in the adjusted position, depression of the pushbutton causes the cam to engage and move a control element, typically in the form of a treadle bar, in the receiver which in turn is operatively connected to the tuning components such as inductor coils, capacitors or the like. When the setting device is unlocked, depression of the pushbutton causes the cam to engage the control element but in this case the setting device itself articulately conforms to the preset condition of the control element, further depression of the pushbutton being effective to actuate the clamping mechanism to clamp the cam in that conforming condition.

Tuners of the type described are typically mass produced in large quantities from inexpensive sheet metal parts. Accordingly, a major problem associated with the success of these devices is the extent to which the dimensional tolerances of the operative components can be controlled in order to provide accurate and reliable tuning. More particularly, it will be noted that the movement and position of the operative tuning cam must be controlled to within extremely close dimensions typically of the order of 0.01 millimeters—that is, the cam member must be brought back to within 0.01 millimeters of its original preset angular position relative to the control element upon subsequent actuation of the pushbutton—in order to provide successful retuning to the preselected frequency of a conventional radio receiver.

Since in the conventional pushbutton device of the type described the actuating cams is pivotally mounted on the slide member and that slide member and/or its associated auxiliary member are slidably mounted in a guide slot in the front panel of the receiver, it is imperative that any significant lateral play between these sliding members and the front panel slot within which they are mounted be eliminated. Such play in even relatively small amounts has been found to vary the angular orientation of the adjusting cam during subsequent actuation of the pushbutton to an extent unacceptable for precise tuning to the selected frequency.

On the other hand, it has been found unfeasible to manufacture the operative components to tolerances sufficient to eliminate such play without increasing the cost of manufacture to an unacceptable level.

In the past, various structures have been devised for reducing or eliminating the normal clearance or play between the operative sliding components and the tuner framework. These structures, however, have always involved a considerable increase in cost both in terms of the number of parts necessary and the increased time and difficulty involved in assembly. In addition, mechanisms of this type invariably involve the use of considerably more complex and costlier tooling than is required with more conventional structures. Finally, mechanisms of this type generally cannot be tested in the assembled condition outside the operative tuner frame without the need for special fixtures. As a result, quality control is considerably more expensive and less effective.

It is therefore a primary object of the present invention to provide a pushbutton device for pre-adjusted actuation of a tuner having a considerably improved tuning accuracy and reliability attained at little if any increase in cost.

It is another object of the present invention to provide a pushbutton mechanism of the type described including means to eliminate undue clearance or play between the operative sliding components and the tuner framework, which means may be incorporated into a one-piece pushbutton assembly and tested as such without the need for special fixtures or tooling.

It is yet another object of the present invention to design an effective and reliable pushbutton bias device designed upon actuation to automatically eliminate all detrimental clearances between the sliding pushbutton assembly and the framework within which it slides, thereby to provide precise retuning to a selected frequency.

To the accomplishment of these and other objects, the present invention comprises an improved pushbutton bias assembly designed to eliminate all lateral play between a slidable pushbutton and a front guide slot within which it is mounted. The assembly comprises an elongated slide or support upon which a tuning cam is pivotally mounted. One end of the slide is received in a rear guide slot in the tuning section of the receiver while the other end is operatively connected to an auxiliary member in spaced relation therewith by means providing limited sliding movement therebetween in response to a given level of pressure on said auxiliary member. That auxiliary member is in turn provided at one end with means engaging the slide member and adapted in response to such relative movement between the two to operatively lockingly engage the tuning cam.

A pushbutton support is mounted in the space between the slide and auxiliary member for relative sliding movement therewith and is provided with inclined slots or grooves receiving projections formed on said auxiliary member. The pushbutton support and auxiliary member are received in the front guide slot of the receiver, the support member being provided with means extending outwardly of the tuner and mounting a pushbutton thereon.

The entire assembly is spring biased to an outer position in which the adjusting cam is spaced from the tuning control element. Upon initial depression of the pushbutton in the unlocked condition, the projections on the auxiliary member cammingly engage the inclined slots on the pushbutton support, those projections being guided along the inclined slots whereby the auxiliary member and pushbutton support move laterally within the front guide slot in opposite directions until they have spread apart sufficiently to eliminate all clearance or play within that slot. Once the auxiliary member and pushbutton support have engaged opposite sides of the front panel slots, all three members are moved together inwardly until the adjusting cam engages the tuning control element within the receiver. The cam is rotatably adjusted to conform to the current position of that control element (established by the continuous tuning mechanism) after which further inward pressure on the pushbutton is effective to cause the slide to slip with respect to the auxiliary member, thereby actuating the clamping mechanism to clamp the adjusting cam in the properly adjusted position.

The pushbutton is thus set to the preselected frequency so that subsequent actuation, after changing stations, will cause the locked adjusting cam to operatively engage the tuning control element associated therewith and return it to the identical angular position corresponding to the preselected frequency. It will be appreciated that such subsequent pushbutton actuation involves the identical camming action between the auxiliary member and the pushbutton support effected during initial presetting of the adjusting cam. Accordingly, during each subsequent pushbutton tuning operation, the lateral clearance in the front guide slot is eliminated and the slide is brought to the same angular orientation prior to operative tuning engagement whereby tuning accuracy and consistency is assured.

To the accomplishment of the above, and to such other objects as may hereinafter appear, the present invention relates to a pushbutton construction and bias device therefor as defined in the appended claims and as described herein with reference to the accompanying drawings, in which:

Figure 1:
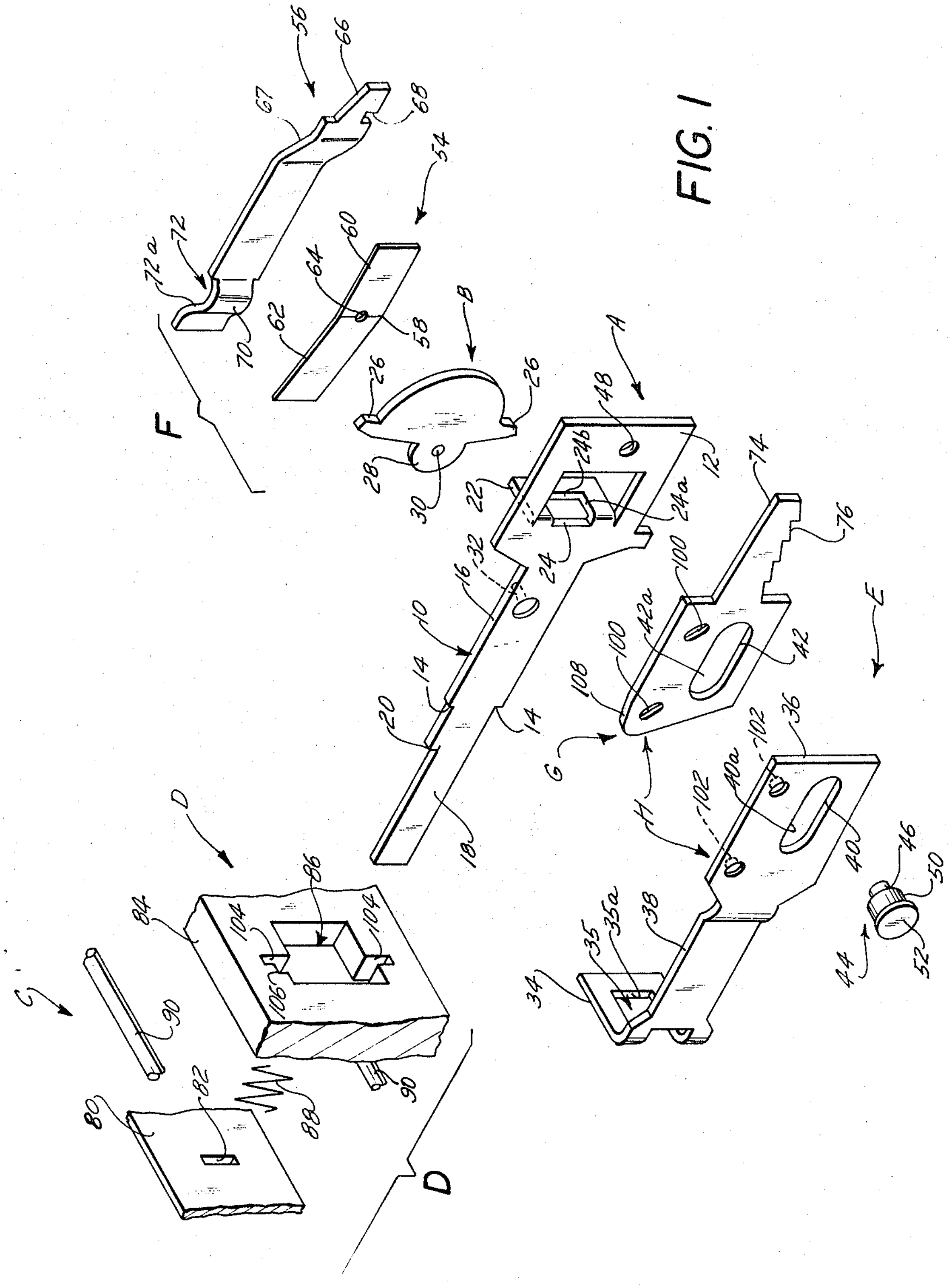
FIG. 1 is an exploded perspective view of the pushbutton device and mounting structure of the present invention.

Referring to the drawings, as here specifically disclosed, the pushbutton unit of the present invention comprises a slide generally designated A upon which an adjusting cam generally designated B is pivotally mounted so as to provide for angular adjustment of a tuning control element generally designated C positioned within a tuning receiver framework generally designated D. An auxiliary member generally designated E is operatively mounted on slide A for limited sliding movement relative thereto, that relative sliding movement being effective to actuate a clamping means generally designated F, operatively connected between slide A and auxiliary member E and effective upon such actuation to clampingly lock the adjusting cam against pivotal movement on slide A. Mounted between slide A and auxiliary member E at one end is a pushbutton support member G operatively drivingly connected to the auxiliary member E by camming means H and adapted to carry a pushbutton for manual actuation of the assembly.

Figures 2, 3, 4:
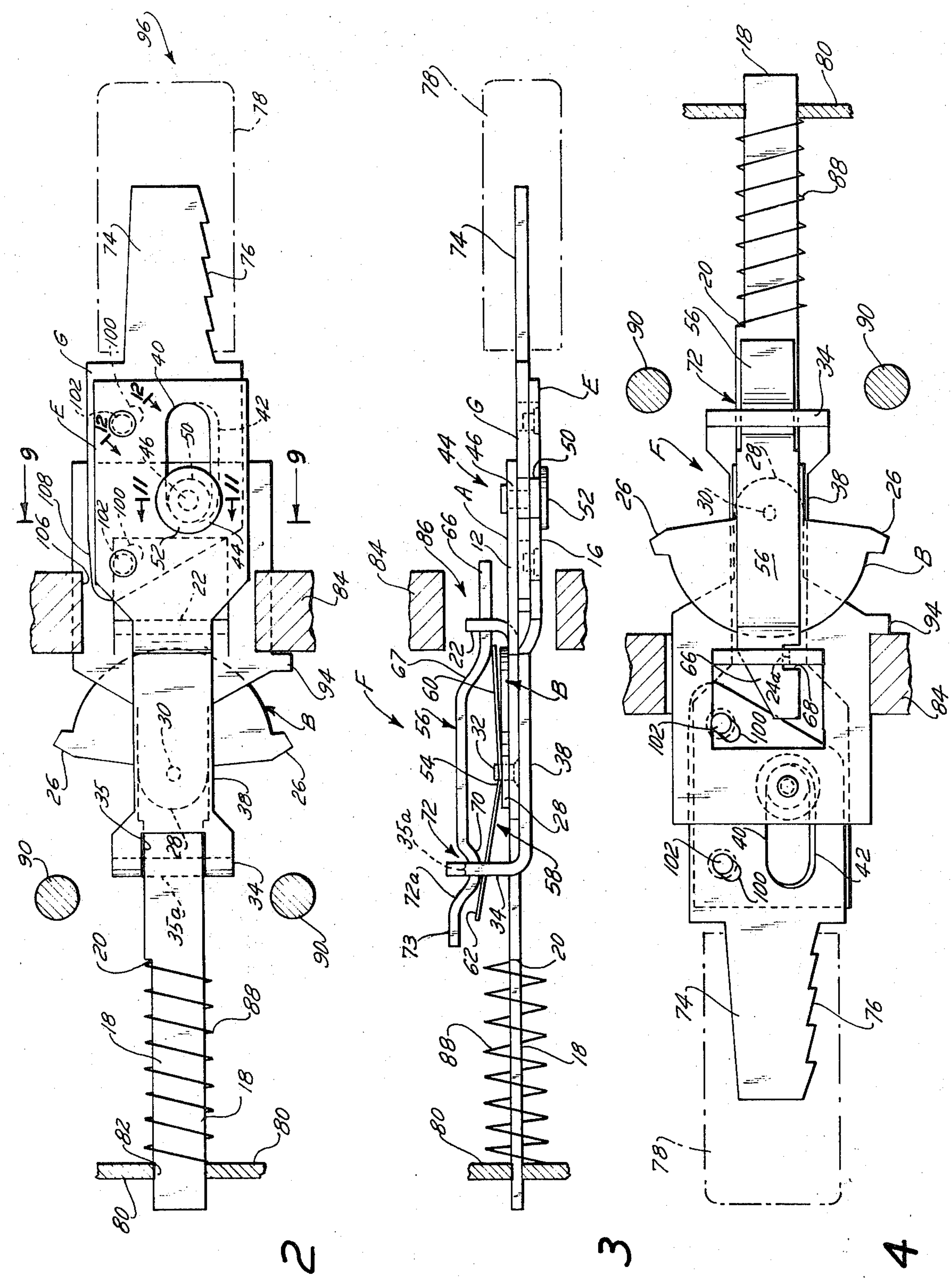
FIG. 2 is a front side elevational view of the assembled pushbutton device in its outer position with the adjusting cam unlocked.
FIG. 3 is a top plan view of the device of FIG. 2.
FIG. 4 is a rear side elevational view of the device of FIG. 2.
Figure 7:
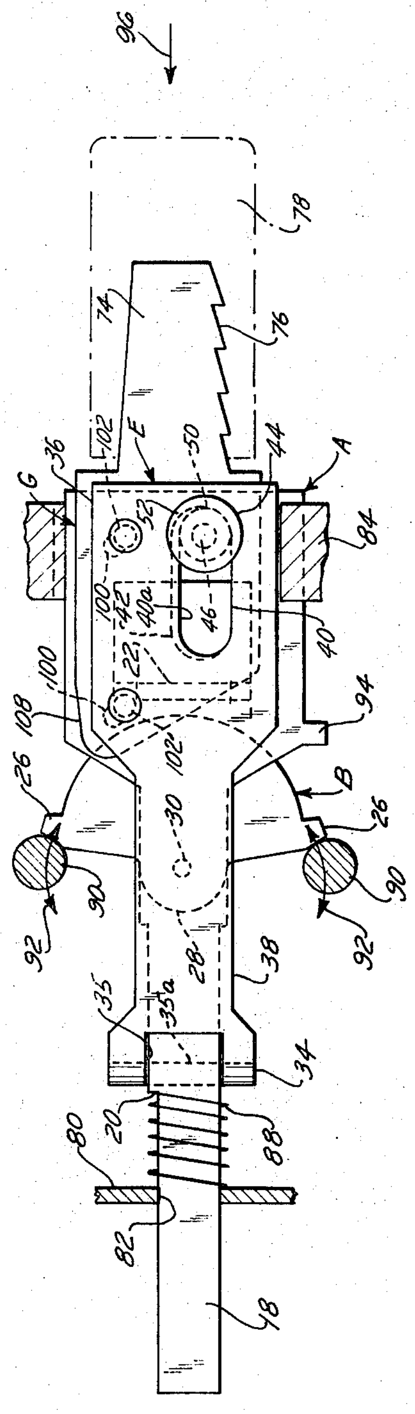
FIG. 7 is a front side elevational view of the pushbutton device with the pushbutton in its inner position and the adjusting cam locked in a preselected adjusting position.

The slide A is slidably mounted within the receiver framework C and is movable along with auxiliary member E and pushbutton support G between the outer position illustrated in FIG. 2 and the inner position illustrated in FIG. 7, the adjusting cam B, in the latter position engaging the tuning control element C. Upon such initial engagement, the auxiliary member E slips with respect to the slide A thereby to actuate the clamping means F to lock the adjusting cam in an angular position corresponding to the current position of the tuning control element C. The adjusting cam B thereafter remains locked in its preselected condition, subsequent actuation of the pushbutton (after tuning to a different frequency) being effective to adjust the tuning control element to its previous position.

During initial setting and subsequent retuning, the camming means H is effective to automatically provide lateral spreading of the pushbutton support and auxiliary member to eliminate all lateral clearance between the assembly and the receiver framework F thereby to insure consistency in the angular orientation of the slide A for accurate tuning adjustment.

Turning now to the details of the embodiment here illustrated and referring specifically to FIG. 1, support A is in the form of an elongated plate of metal or the like and comprises an integrally formed elongated tongue 10 and a wider flat portion 12. Tongue 10 is formed with shoulders 14 defining a slightly wider portion 16 connected to base 12 and a narrow portion 18 extending to the left as viewed in FIG. 1. Portion 18 is stepped at 20 for a purpose which will hereinafter be apparent.

Base 12 is provided with a centrally located tab 22 integrally formed thereon and bent out of the plane thereof substantially at right angles, that tab being formed with a slot 24. Cam B is in the form of a flat member having a pair of wings 26 and a forwardly extending stud 28 apertured at 30 for a relatively loose pivotal mounting on a pin 32 or the like extending laterally from portion 16 of tongue 10.

Auxiliary member E is also formed of an elongated sheet of metal or the like and is provided at one end with a bent over portion defining a laterally extending tab 34 slotted at 35 and at its other end with a relatively wide flat plate 36, a narrow connecting member 38 extending therebetween. As best illustrated in FIG. 3, auxiliary member E is adapted to be mounted adjacent slide A in side by side relationship, portion 16 of tongue 10 engaging connecting member 38 and portion 18 extending through slot 35. Plate 36 is slightly offset downwardly (as viewed in FIG. 3) from the plane of connecting member and is thereby spaced from base portion 12 of slide A, the pushbutton support member G being received therebetween. Auxiliary member E and support member G are formed with registering elongated slots 40 and 42, respectively, those slots receiving a rivet 44. The slot 42 on pushbutton support G is wider than slot 40 for reasons which will hereinafter appear. Rivet 44 is formed with a narrow stud 46 at one end extending through an aperture 48 in base portion 12 of slide A and secured thereto as by being turned over the edge of aperture 48 at the other side of base 12. The main body 50 of the rivet is formed of a diameter slightly smaller than the width of slot 40 and is thus adapted to move within that slot. A wider flange 52 at the other end of rivet 44 is adapted to seat on the bottom of plate 36 (as viewed in FIG. 3), thereby securing the slide A, support G and auxiliary member E together while allowing relative sliding movement therebetween.

Clamping means F comprises a leaf spring generally designated 54 and a lock lever generally designated 56. Spring 54 is in the form of a thin flat resilient strip of metal or the like bent slightly inwardly toward lever 56 along bend line 58 defining angularly inclined portions 60 and 62. Spring 54 is secured to the free end of pin 32 (upon which adjusting cam B is pivotally mounted) at a location 64 on bend line 58. Lock lever 56 is provided with a tapered end 66 bent downwardly (as viewed in FIG. 3) at 67 received within slot 24 in tab 22 on slide A and retained in position therein by a recess 68 which fits over the edge 24$a$ of slot 24 (see FIG. 4). The other end of lock lever 56 extends through slot 35 in tab 34 on auxiliary member E and is formed with a valley-like bend 70 forming a recess 72, portion 62 of leaf spring 54 resiliently engaging the underside of bend 70 to bias the recess 72 into firm engagement with the edge 35$a$ of slot 35. In the position illustrated in FIG. 3, the other end 60 of spring 56 is slightly inclined upwardly to the right, spaced from cam B and resiliently engaging the underside of the tapered end 66 of the lock lever 56. Accordingly, spring 54 engages cam B only along bend line 58 with only slight pressure and thus there is little frictional resistance to the pivotal movement of cam B in the unlocked position of FIG. 3.

Pushbutton support G is formed with an elongated tongue 74 extending to the right as viewed in FIG. 1 and provided with a serrated or stepped edge 76 adapted to holdingly mount a manually engageable pushbutton 78 (see FIG. 2) of molded plastic or the like. As best illustrated in FIGS. 1 and 2 the entire unit as heretofore described is adapted to be slidingly mounted within the receiver framework D. As here only fragmentarily shown, that framework comprises a rear mounting wall 80 having a slot 82 slidingly receiving the narrow end 18 of tongue 10 on slide A and a front panel 84 having an opening 86 adapted to slidingly receive base portion 12 of slide A, plate 36 of auxiliary member E and the main body portion of pushbutton support member G (see FIGS. 9 and 10).

As best shown in FIG. 3, the assembly is biased to the right (as viewed in that figure) by means of a compression coil spring 88 mounted concentrically on the narrow end 18 of tongue 10 between the rear wall 80 and the shoulder 20 formed on tongue 10. In the position there illustrated, the adjusting cam B is spaced substantially to the right of the tuning control member here schematically illustrated by a treadle bar 90 pivotally mounted as shown by arrows 92. The outer position illustrated in FIG. 2 is defined by a stop member 94 formed integral on base portion 12 of slide A, extending downwardly therefrom (as viewed in FIG. 2) and biased into engagement with the front panel 84 of the receiver by compression spring 88 as shown.

Figure 8:
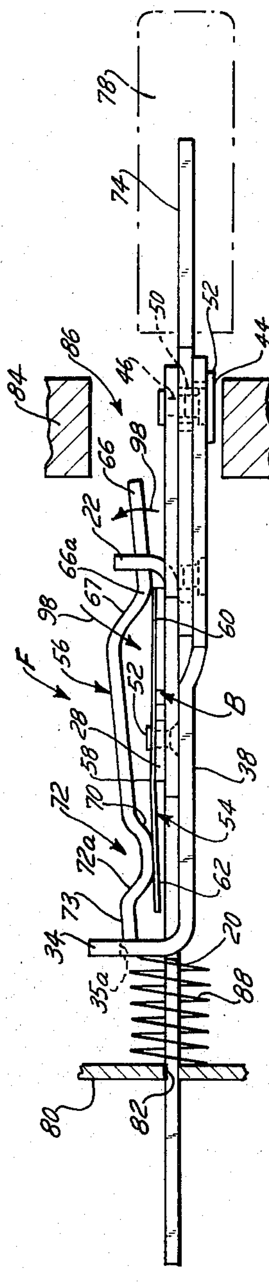
FIG. 8 is a top plan view of the device of FIG. 7.

As previously noted, in the position illustrated in FIGS. 2 and 3, the adjusting cam B is relatively freely pivotally mounted on slide A. Accordingly, upon movement of the assembly to the left by manual pressure of the pushbutton 78 transmitted via the camming means H to the auxiliary member E and slide A, as indicated by arrow 96 against the bias of compression spring 88, the wings 26 of adjusting cam B are brought into engagement with the treadle bar 90 and the cam is pivoted into conformity with the angular orientation of the treadle bar. It will be appreciated that once the cam has rotated to an angular orientation in which both wings 26 engage the treadle bar 90, that treadle bar serves to prevent further movement of the slide A to the left and accordingly further pressure on the pushbutton in the direction of arrow 96 will effect a slippage of the auxiliary member E to the left relative to the slide A. As best illustrated in FIGS. 7 and 8, such further pressure causes the edge 35$a$ of slot 35 on tab 34 to slide up the incline 72$a$ defining the recess 72 and over the free end 73 of lock lever 56. The lock lever 56 is accordingly pivoted counterclockwise as indicated by arrow 98 around the fulcrum point defined by the engagement of tapered end 66 with the upper edge 24$b$ of slot 24 in tab 22. As a result, the base 66$a$ of the tapered end 66 of lock lever 56 operatively engages the righthand end 60 of spring 54 and presses it into firm locking engagement with the body of cam B along substantially its entire length thereby to provide a firm clamping action on cam B to lock it in the position established by treadle bar 90.

It will be appreciated as shown in FIG. 8 that once the upper edge 35$a$ of slot 35 slides out of the recess 72 over the hump 72$a$ and onto the free end 73 it will maintain the locking lever 56 in the locked position (illustrated in FIG. 8) unless and until the auxiliary member E is pulled to the right with substantial force, as by pulling outwardly on the pushbutton 78.

After the cam has been locked in position by firm pressure on the pushbutton 78, release of the pressure allows the assembly to return to its outer position under the influence of spring 88, the cam remaining in the locked condition.

Subsequent reactuation of the pushbutton is effective to bring the wings 26 of the locked adjusting cam B again into operative engagement with the treadle bar 90. During reactuation, however, the cam B is locked against pivotal movement and thus is effective to pivot the treadle bar 90 into conformity with the preset angular orientation of the cam B thereby to tune and retune the preselected frequency.

It will be apparent that the accuracy with which the circuit is returned to the selected frequency depends upon the accuracy with which the adjusting cam B may be repeatedly returned to the angular orientation in which it was originally established during the setting procedure described above. While the clamping mechanism F is effective to firmly lock the adjusting cam B against rotation relative to slide A, slight variations in the angular orientation of the slide itself at the moment of engagement between cam B and treadle bar 90 may significantly affect tuning accuracy. Such variations in prior art devices of this type are unavoidable as a result of the normal clearances between sliding components inexpensively mass produced.

These clearances are substantially eliminated in accordance with the present invention by the camming means H. As best illustrated in FIG. 1, that camming means comprises a pair of spaced inclined slots 100 formed on pushbutton support G adapted to receive a pair of projections 102 formed on plate 36 of auxiliary member E in any suitable manner, such as by punching. Slots 100 are inclined upwardly to the left as viewed in FIG. 1 and in the normal assembled condition of the unit the pushbutton support is supported by the projections 102 received in the upper left hand corner of slots 100 (as viewed in FIG. 1), the upper edge **42*a* of slot 42 being level with the upper edge 40*a* of slot 40 and resting on the body 50 of the rivet 44 (see FIG. 12**).

Figure 9:
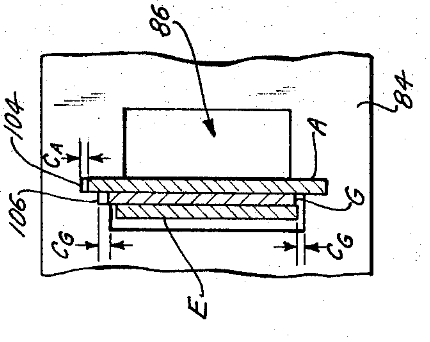
FIG. 9 is a cross sectional view taken generally along the line 9—9 of FIG. 2.

As best shown in FIGS. 1 and 9, the aperture 86 in the front panel 84 is formed with a first slot 104 receiving slide A with a normal clearance $C_A$ and a second smaller slot 106 receiving pushbutton support G with the normal clearance $C_G$.

Figure 5:
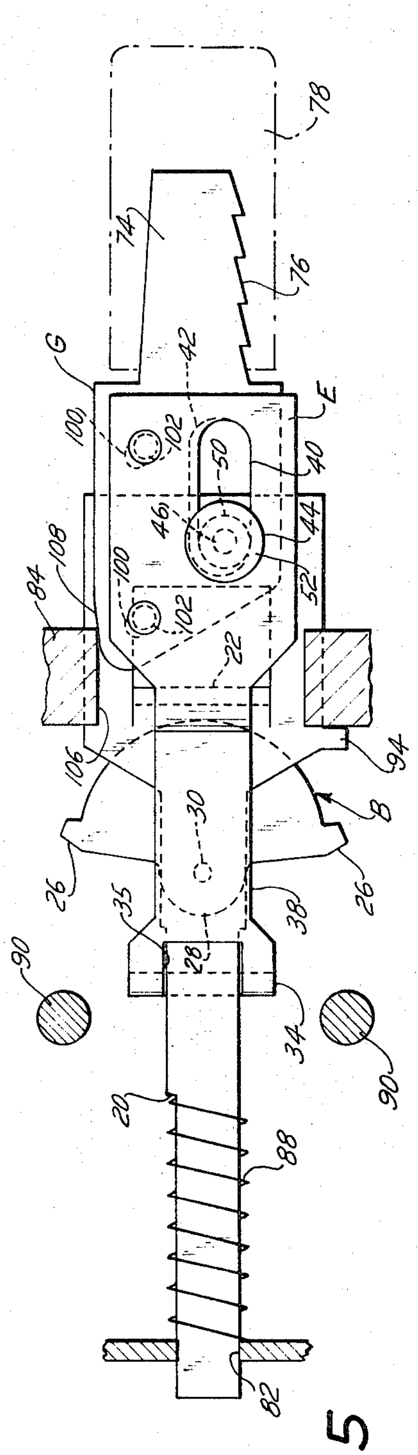
FIG. 5 is a front side elevational view similar to FIG. 2 of the pushbutton device in its outer position with the pushbutton support biased upwardly into engagement with the front guide.
Figure 6:
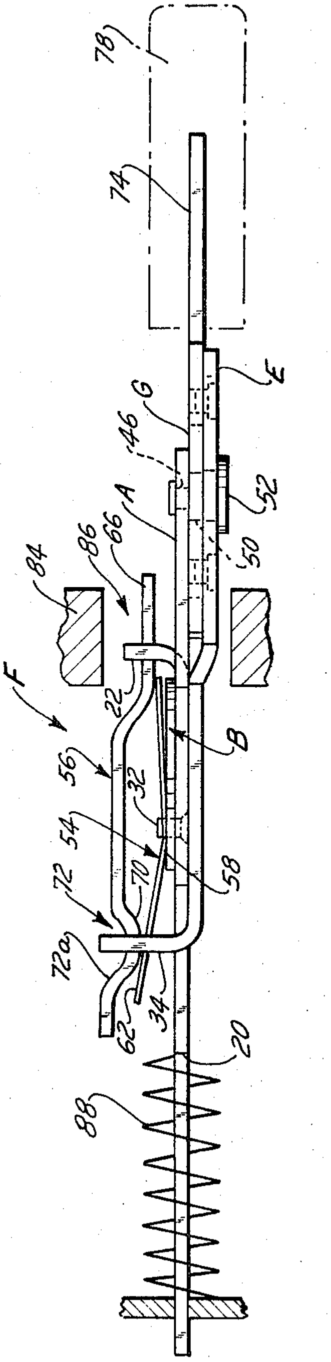
FIG. 6 is a top plan view of the device of FIG. 5.
Figure 12:
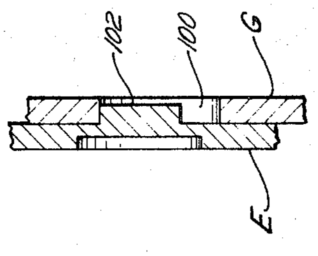
FIG. 12 is a cross sectional view taken along the line 12—12 of FIG. 2.
Figure 11:
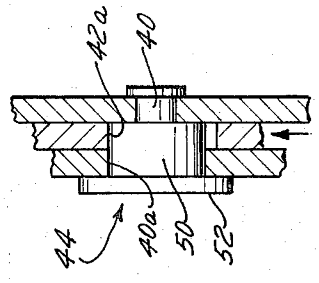
FIG. 11 is a cross sectional view taken along the line 11—11 of FIG. 1.
Figure 10:
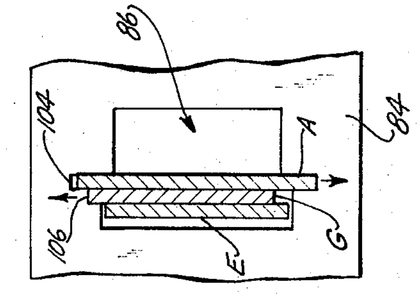
FIG. 10 is a cross sectional view taken generally along the line 10—10 of FIG. 5.

In the outer position of the unit illustrated in FIG. 1, the slide A rests on the lower surface of slot 104 and the pushbutton support G and auxiliary member E are supported by rivet 44 (as illustrated in FIG. 12) within the front panel aperture 86 spaced from the walls thereof as illustrated in cross section in FIG. 9. As the pushbutton is initially manually engaged with slight pressure in the direction of arrow 96, the support member G is guided by slots 100 which are effective by their camming engagement with projections 102 on auxiliary member E to move the pushbutton support upwardly to the left into engagement with the upper edge of slot 106 while at the same time exerting downward pressure on the slide A to maintain it in engagement with the bottom edge of slot 104 as shown in FIGS. 5 and 10, thereby to eliminate all clearance between the sliding members A and G and the front panel aperture 86. The forward edge 108 of the pushbutton support G is inclined slightly downwardly to the left (as viewed in FIG. 5) to insure that all clearance is eliminated during the entire leftward stroke. The camming engagement of inclined slots 100 with projections 102 thus insures that during the entire pushbutton stroke the slide A rides firmly on the bottom edge of slot 104 and as a result assumes an angular orientation for each subsequent tuning operation identical to that which it had during initial setting. It will of course be apparent that the slots 100 and 42 on pushbutton support G should be large enough to accommodate the largest anticipated lateral play within the front panel aperture 86 so that spreading of support G and slide A is limited only by the walls of guide slots 104 and 106.

It will be appreciated from the foregoing that the present invention provides a simple and inexpensive improved pushbutton mechanism adapted to significantly increase pushbutton tuning accuracy. Tuning accuracy is enhanced by the provision for an automatic biasing mechanism adapted to eliminate all lateral play between the pushbutton slide member and the guide aperture in the front panel within which it moves. By contrast to prior art mechanisms of this type, this biasing of the pushbutton slide within the tuner framework is accomplished in a simple and inexpensive onepiece mechanism utilizing a minimum number of parts. In addition, unlike prior art designs the pushbutton device described herein may be easily assembled and pretested without the need for special fixtures. Indeed, as a result of the one-piece design described herein, the pushbutton assembly may be independently preassembled and tested and subsequently inserted within the tuner assembly in a separate operation either as initial equipment or as a replacement part.

While only a single embodiment of the present invention has been herein specifically described, it will be apparent that many variations may be made therein, all within the scope of the invention, as defined in the following claims.

I claim:

1. A pushbutton assembly for adjustment of a tuning control element comprising a frame, a slide mounted on said frame for reciprocating movement relative to said tuning control element, tuning control element adjustment means pivotally mounted on said slide and adapted to engage said tuning control element as said slide is moved in a first direction and, in an unlocked condition, to pivot on said slide in response to said engagement, locking means mounted on said slide and effective upon engagement of said adjustment means with said tuning control element to lock said adjustment means to said slide in the angular orientation thereof established by said engagement with said tuning control element and to maintain said adjustment means thus locked during subsequent reciprocation of said slide, pushbutton mounting means adapted to carry a pushbutton for manual engagement, means independent of said frame operatively securing said pushbutton mounting means to said slide for limited rectilinear sliding movement relative thereto, means operative between said pushbutton mounting means and said slide, and effective in response to pressure on said pushbutton mounting means in said first direction to move said pushbutton mounting means and said slide in opposite directions perpendicular to said first direction into engagement with said frame, an auxiliary member mounted on said slide for limited movement relative thereto in said first direction in response to engagement of said adjustment means with said tuning control element, said locking means being operatively connected to said slide and said auxiliary member and adapted to be actuated in response to said relative movement between said slide and said auxiliary member, said means for moving said pushbutton mounting means and said slide in opposite directions comprising a cam surface on one of said auxiliary member and said pushbutton mounting means inclined to said first direction and a cam follower on the other of said auxiliary members and said pushbutton mounting means engaging said cam surface, and said auxiliary member includes a portion spaced from said slide, said pushbutton mounting means being received within the space defined between said slide and said spaced portion, and means effective to capture said pushbutton mounting means between said slide and said spaced portion.

2. The pushbutton assembly of claim 1, wherein said cam surface comprises a pair of spaced elongated guide grooves, and said cam follower comprises a pair of spaced projections received within said guide grooves, the engagement between said grooves and said projections being effective to move said pushbutton mounting means relative to said auxiliary member in the direction of said inclined grooves.

3. The pushbutton assembly of claim 2, wherein said spaced portion of said auxiliary member and said pushbutton mounting means are provided with elongated generally aligned slots extending in said first direction and further comprising stud means extending through said slots and secured at one end to said slide, flange means on the other end of said stud means engaging said spaced portion, said slot in said pushbutton mounting means being wide enough to permit movement of said pushbutton mounting means in the direction of said inclined grooves.

* * * * *